(12) United States Patent
Pelella et al.

(10) Patent No.: US 7,033,916 B1
(45) Date of Patent: Apr. 25, 2006

(54) SHALLOW JUNCTION SEMICONDUCTOR AND METHOD FOR THE FABRICATION THEREOF

(75) Inventors: Mario M. Pelella, Mountain View, CA (US); William George En, Milpitas, CA (US); Eric Paton, Morgan Hill, CA (US); Witold P. Maszara, Morgan Hill, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 68 days.

(21) Appl. No.: 10/770,990

(22) Filed: Feb. 2, 2004

(51) Int. Cl.
*H01L 21/22* (2006.01)
*H01L 21/336* (2006.01)
*H01L 21/8234* (2006.01)
*H01L 21/44* (2006.01)

(52) U.S. Cl. .................. 438/558; 438/197; 438/655; 438/682

(58) Field of Classification Search ............ 438/558, 438/586, 475, 197, 649, 651, 664, 719, 721, 438/655, 652, 682
See application file for complete search history.

(56) References Cited

U.S. PATENT DOCUMENTS

| | | | |
|---|---|---|---|
| 4,692,348 A | 9/1987 | Rubloff et al. | |
| 5,395,787 A | 3/1995 | Lee et al. | |
| 6,136,636 A | 10/2000 | Wu | |
| 6,326,251 B1 | 12/2001 | Gardner et al. | |
| 6,555,438 B1 * | 4/2003 | Wu | 438/305 |
| 6,613,623 B1 * | 9/2003 | Tsai et al. | 438/197 |
| 6,873,057 B1 * | 3/2005 | Chen et al. | 257/777 |

* cited by examiner

*Primary Examiner*—Chuong Anh Luu
(74) *Attorney, Agent, or Firm*—Mikio Ishimaru

(57) ABSTRACT

A method of forming an integrated circuit with a semiconductor substrate is provided. A gate dielectric is formed on the semiconductor substrate, and a gate is formed on the gate dielectric. A super-saturated doped source silicide metallic layer is formed on the semiconductor substrate adjacent the gate and the gate dielectric. The silicide metallic layer incorporates a substantially uniformly distributed dopant therein in a substantially uniform super-saturated concentration. The silicide metallic layer is reacted with the semiconductor substrate therebeneath to form a salicide layer and outdiffuse the dopant from the salicide layer into the semiconductor substrate therebeneath. The outdiffused dopant in the semiconductor substrate is then activated to form a shallow source/drain junction beneath the salicide layer. An interlayer dielectric is then deposited above the semiconductor substrate, and contacts are formed in the interlayer dielectric to the salicide layer.

14 Claims, 4 Drawing Sheets

SHALLOW JUNCTION SEMICONDUCTOR AND METHOD FOR THE FABRICATION THEREOF

BACKGROUND

1. Technical Field

The present invention relates generally to semiconductor technology, and more specifically to shallow junction formation in semiconductor integrated circuit devices.

2. Background Art

At the present time, electronic products are used in almost every aspect of life, and the heart of these electronic products is the integrated circuit. Integrated circuits are used in everything from airplanes and televisions to wristwatches.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each wafer worth hundreds or thousands of dollars.

Integrated circuits are made up of hundreds to millions of individual components. One common component is the semiconductor transistor. The most common and important semiconductor technology presently used is silicon-based, and the most preferred silicon-based semiconductor device is a Complementary Metal Oxide Semiconductor ("CMOS") transistor.

The principal elements of a CMOS transistor generally consist of a silicon substrate having shallow trench oxide isolation regions cordoning off transistor areas. The transistor areas contain polysilicon gates on silicon oxide gates, or gate oxides, over the silicon substrate. The silicon substrate on both sides of the polysilicon gate is slightly doped to become conductive. These lightly doped regions of the silicon substrate are referred to as "shallow source/drain junctions", which are separated by a channel region beneath the polysilicon gate. A curved silicon oxide or silicon nitride spacer, referred to as a "sidewall spacer", on the sides of the polysilicon gate allows deposition of additional doping to form more heavily doped regions of the shallow source/drain ("S/D") junctions, which are called "deep S/D junctions". The shallow and deep S/D junctions together are collectively referred to as "S/D junctions".

To complete the transistor, a silicon oxide dielectric layer is deposited to cover the polysilicon gate, the curved spacer, and the silicon substrate. To provide electrical connections for the transistor, openings are etched in the silicon oxide dielectric layer to the polysilicon gate and the S/D junctions. The openings are filled with metal to form electrical contacts. To complete the integrated circuits, the contacts are connected to additional levels of wiring in additional levels of dielectric material to the outside of the dielectric material.

In operation, an input signal to the gate contact to the polysilicon gate controls the flow of electric current from one S/D contact through one S/D junction through the channel to the other S/D junction and to the other S/D contact.

Transistors are fabricated by thermally growing a gate oxide layer on the silicon substrate of a semiconductor wafer and forming a polysilicon layer over the gate oxide layer. The oxide layer and polysilicon layer are patterned and etched to form the gate oxides and polysilicon gates, respectively. The gate oxides and polysilicon gates in turn are used as masks to form the shallow S/D regions by ion implantation of boron or phosphorus impurity atoms into the surface of the silicon substrate. The ion implantation is followed by a high-temperature anneal above 700° C. to activate the implanted impurity atoms to form the shallow S/D junctions.

A silicon nitride layer is deposited and etched to form sidewall spacers around the side surfaces of the gate oxides and polysilicon gates. The sidewall spacers, the gate oxides, and the polysilicon gates are used as masks for the conventional S/D regions by ion implantation of boron or phosphorus impurity atoms into the surface of the silicon substrate into and through the shallow S/D junctions. The ion implantation is again followed by a high-temperature anneal above 700° C. to activate the implanted impurity atoms to form the S/D junctions.

After formation of the transistors, a silicon oxide dielectric layer is deposited over the transistors and contact openings are etched down to the S/D junctions and to the polysilicon gates. The contact openings are then filled with a conductive metal and interconnected by formation of conductive wires in other interlayer dielectric ("ILD") layers.

As transistors have decreased in size, it has been found that the electrical resistance between the metal contacts and the silicon substrate or the polysilicon has increased to the level where it negatively impacts the performance of the transistors. To lower the electrical resistance, a transition material is formed between the metal contacts and the silicon substrate or the polysilicon. The best transition materials have been found to be cobalt silicide ($CoSi_2$) and titanium silicide ($TiSi_2$).

The silicides are formed by first applying a thin layer of the cobalt or titanium on the silicon substrate above the S/D junctions and the polysilicon gates. The semiconductor wafer is subjected to one or more annealing steps at temperatures above 800° C. and this causes the cobalt or titanium to selectively react with the silicon and the polysilicon to form the metal silicide. The process is generally referred to as "siliciding". Since the shallow trench oxide and the sidewall spacers will not react to form a silicide, the silicides are aligned over the S/D junctions and the polysilicon gates so the process is also referred to as "self-aligned siliciding", or "saliciding".

Salicidation technology is vital for improving the operating speed of modern semiconductor devices with sub-micron feature sizes. The salicide technology is widely use to increase the packing density of integrated circuits and to reduce the circuit interconnect resistance for high-speed operation. With the continuous decrease in device sizes (transistors becoming narrower and thinner and transistor channels becoming shorter), salicidation problems like junction punchthrough, current leakage, and contact resistance continue to reduce product yields and reliability.

In general, salicidation results in high junction leakage due to metal penetration into the silicon substrate. The penetration of the metal "spikes" the junction, causing the current leakage.

Residual metal from the salicidation process can also cause leakage. The silicide across the sidewall spacers may not be totally removed after the salicidation. The residual metal can cause a bridge between adjacent circuit features, like the gate and the S/D regions, causing current leakage.

Nevertheless, as device dimensions continue to be scaled to smaller and smaller dimensions, it is necessary to scale down extension junction depths as well. Furthermore, shallow junctions are increasingly needed to control adverse charge-sharing effects (two dimensional short channel effects) in advanced devices such as metal oxide field effect transistors. Extended ultra-shallow S/D junctions can improve such negative effects, can suppress the short channel effect, and can improve device operating speeds.

However, existing shallow S/D junction fabrication technologies, such as ion implantation followed by rapid thermal annealing, have not succeeded in solving all the problems related to fabricating increasingly shallow S/D junctions, and to connecting metal contacts to them.

Solutions to these problems have been long sought but prior developments have not taught or suggested any solutions and, thus, solutions to these problems have long eluded those skilled in the art.

DISCLOSURE OF THE INVENTION

The present invention provides a method of forming an integrated circuit. A gate dielectric is formed on a semiconductor substrate, and a gate is formed on the gate dielectric. A super-saturated doped source silicide metallic layer is formed on the semiconductor substrate adjacent the gate and the gate dielectric. The silicide metallic layer incorporates a substantially uniformly distributed dopant therein in a substantially uniform super-saturated concentration. The silicide metallic layer is reacted with the semiconductor substrate therebeneath to form a salicide layer and outdiffuse the dopant from the salicide layer into the semiconductor substrate therebeneath. The outdiffused dopant in the semiconductor substrate is then activated to form a shallow source/drain junction beneath the salicide layer. An interlayer dielectric is then deposited above the semiconductor substrate, and contacts are formed in the interlayer dielectric to the salicide layer. This method significantly improves the formation of very shallow source/drain junctions for integrated circuits.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
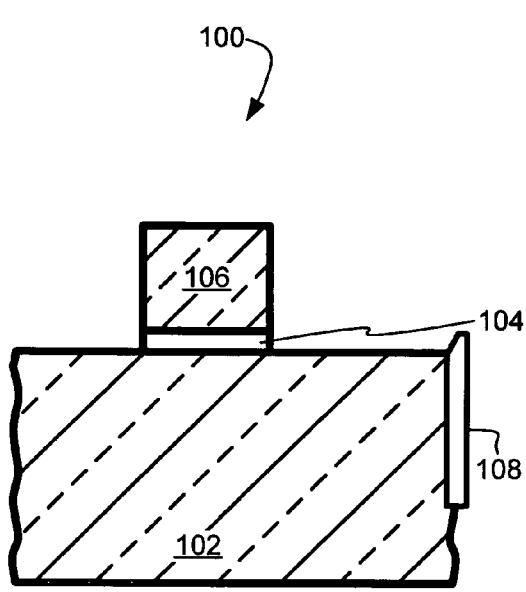
FIG. 1 is a view of an integrated circuit in an intermediate stage of fabrication in accordance with the present invention.

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. In addition, the drawings showing embodiments of the device are semi-diagrammatic and not to scale and, particularly, some of the dimensions are for the clarity of presentation and may be exaggerated in the drawing FIGS. The same numbers will be used in all the drawing FIGS. to relate to the same elements.

The term "horizontal" as used herein is defined as a plane parallel to a substrate or wafer. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Referring now to FIG. 1, therein is shown a semiconductor integrated circuit, and in particular a transistor 100, in an intermediate stage of fabrication in accordance with the present invention.

To form the intermediate stage, a gate dielectric layer, such as silicon oxide, and a conductive gate layer, such as polysilicon, have been deposited on a semiconductor substrate 102 of a material such as silicon. The layers are patterned and etched to form a gate dielectric 104 and a gate 106. The semiconductor substrate 102 has been further patterned, etched, and filled with a silicon oxide material to form a shallow trench isolation ("STI") 108.

Figure 2:
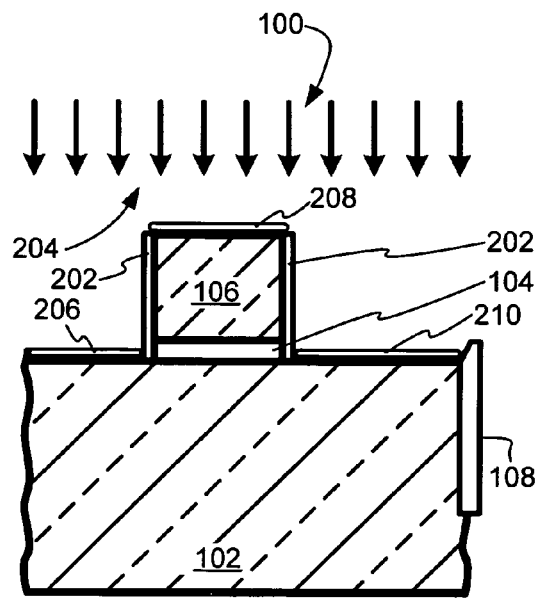
FIG. 2 is the structure of FIG. 1 with an insulating layer and silicide metallic layers formed thereon.

Referring now to FIG. 2, therein is shown the structure of FIG. 1 having an insulating layer 202 formed on the sides of the gate 106. The insulating layer 202 is formed by depositing an insulating film over the structure of FIG. 1 and anisotropically etching the horizontal surfaces. A deposition process 204 is then used to form silicide metallic layers 206, 208, and 210 in accordance with the present invention. The silicide metallic layers 206 and 210 are formed on the surface of the semiconductor substrate 102, and the silicide metallic layer 208 is formed on the gate 106. Advantageously, the silicide metallic layers 206 and 210 can be formed adjacent the gate 106.

The silicide layer deposition process forms the silicide metallic layers 206, 208, and 210 by depositing silicide metal that is doped with a dopant species to be used for subsequently forming very shallow source/drain ("S/D") junctions. For example, the silicide metallic layers may be cobalt (for forming cobalt silicide, $CoSi_2$), nickel (for forming nickel silicide, $NiSi_2$), or platinum (for forming platinum silicide, PtSi). The dopant impurity atoms that are incorporated in the silicide metallic layers 206, 208, and 210 as they are formed may be, for example, arsenic (As), boron (B), or phosphorus (P).

The doped silicide metallic layers 206, 208, and 210 may be formed, for example, by a sputtering process in which both the silicide metal and the dopant are incorporated into the sputter target. In one embodiment, the dopant concentration in the sputter target may be sufficiently high that the sputtered dopant is incorporated into the deposited silicide metallic layers 206, 208, and 210 in a super-saturated concentration (i.e., the dopant concentration is higher than its solid solubility). Such a super-saturated dopant concentration in the deposited silicide metallic layer provides a super-saturated doped source. The super-saturated doped source facilitates subsequent solid-source outdiffusion of the dopant to form very shallow junctions, as further described herein. The use of sputtering to form the super-saturated doped source results in a uniform distribution and concentration of the dopant throughout the silicide metallic layers.

The doped silicide metallic layers 206, 208, and 210 may alternatively be formed by other suitable means, such as, for example, deposition of undoped silicide metallic layers followed by ion implantation of the dopant in a concentration similarly sufficient to create a super-saturated dopant concentration in the silicide metallic layers.

Figure 3:
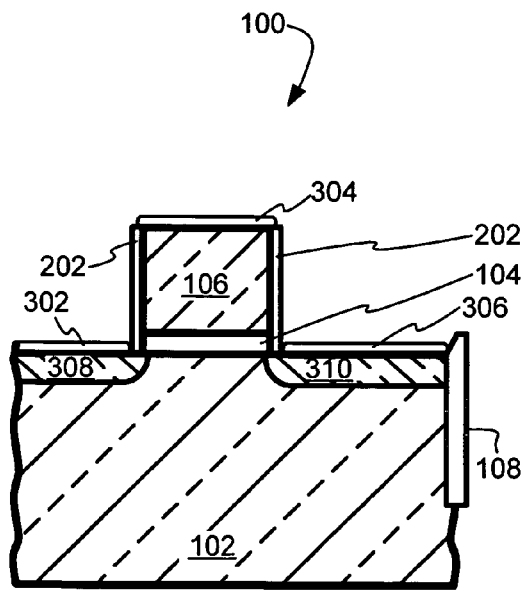
FIG. 3 is the structure of FIG. 2 following formation of salicide layers and shallow source/drain junctions.

Referring now to FIG. 3, therein is shown the structure of FIG. 2 following a heating and annealing step that reacts the deposited silicide metallic layers 206, 208, and 210 (FIG. 2) with the semiconductor substrate 102 and the gate 106 therebeneath. The reaction forms salicide layers 302, 304, and 306 and causes the dopant to outdiffuse from the salicide layers 302 and 306 into the semiconductor substrate 102 therebeneath as it incorporates the silicide metallic layers into the salicide layers. Since the solid solubility of dopants in silicide is very low, the dopants readily eject out of the silicide and go into the silicon substrate therebeneath. The dopant that remains behind in the salicide layers 302 and 306 will also be uniformly distributed and concentrated therein as a residual result from the prior uniform distribution and concentration of the dopant throughout their predecessor silicide metallic layers.

The thermal outdiffusion of the dopant into the semiconductor substrate 102 activates the outdiffused dopant atoms in the semiconductor substrate 102 to form very shallow S/D junctions immediately beneath the salicide layers 302 and 306. The process forms shallow S/D junctions 308 and 310 that are directly beneath and follow the contour of the salicide layers 302 and 306. This advantageously reduces junction leakage.

Figure 4:
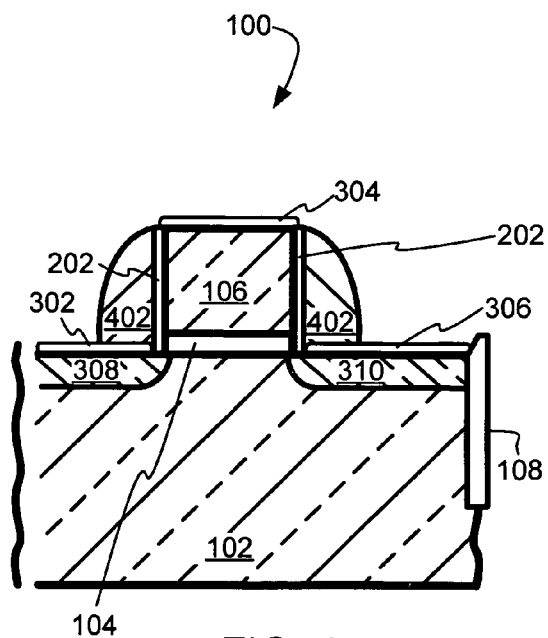
FIG. 4 is the structure of FIG. 3 after formation of a sidewall spacer.

Referring now to FIG. 4, therein is shown the structure of FIG. 3 after formation of a sidewall spacer 402. The sidewall spacer 402, generally of silicon nitride, is a deposited layer that is etched in conventional manner to form a conventional curved shape as shown.

Figure 5:
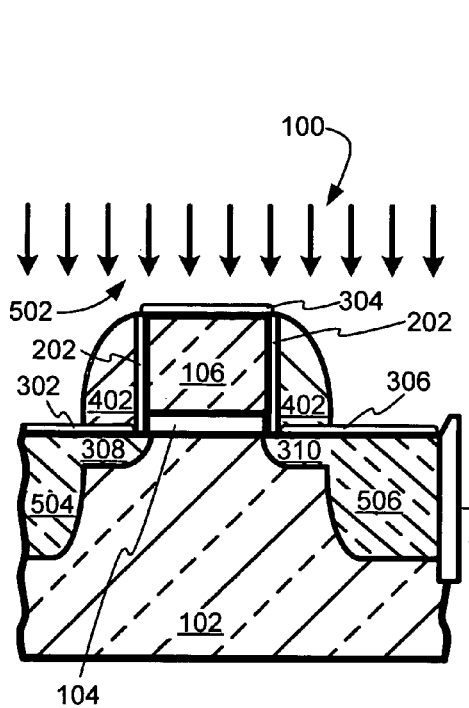
FIG. 5 is the structure of FIG. 4 during ion implantation to form deep source/drain junctions.

Referring now to FIG. 5, therein is shown the structure of FIG. 4 during an ion implantation 502 to form deep S/D junctions 504 and 506.

The sidewall spacer 402, the gate 106, and the STI 108 act as masks for the formation of the deep S/D junctions 504 and 506 by the ion implantation 502 of arsenic, boron, or phosphorus impurity atoms into the surface of the semiconductor substrate 102 and into and through the shallow S/D junctions 308 and 310, respectively. The ion implantation 502 is followed by a high-temperature anneal above 700° C. to activate the implanted impurity atoms to form the deep S/D junctions 504 and 506.

Figure 6:
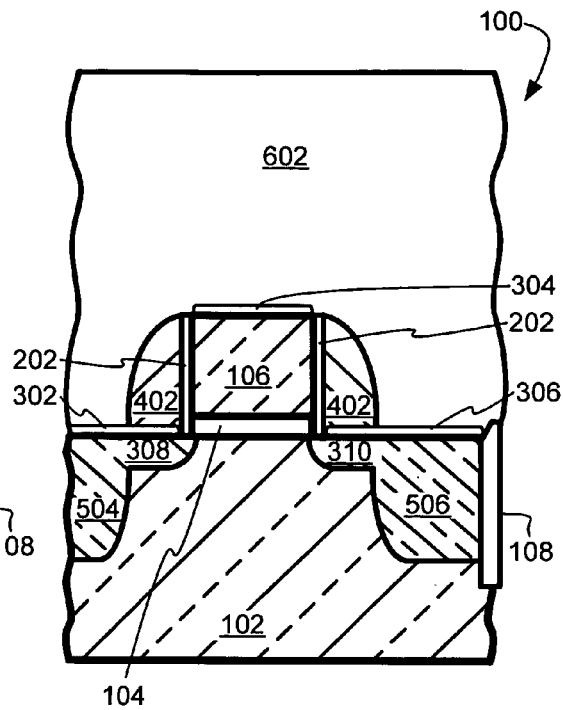
FIG. 6 is the structure of FIG. 5 after deposition of a dielectric layer over the silicide, the sidewall spacer, and shallow trench isolation.

Referring now to FIG. 6, therein is shown the structure of FIG. 5 after deposition of a dielectric layer 602 over the salicide layers 302, 304, and 306, the sidewall spacer 402, and the STI 108.

In various embodiments, the dielectric layer 602 is of dielectric materials such as silicon oxide ($SiO_x$), tetraethylorthosilicate (TEOS), borophosphosilicate (BPSG) glass, etc., with dielectric constants from 4.2 to 3.9, or low dielectric constant dielectric materials such as fluorinated tetraethylorthosilicate (FTEOS), hydrogen silsesquioxane (HSQ), bis-benzocyclo-butene (BCB), tetramethylorthosilicate (TMOS), octamethyleyclotetrasiloxane (OMCTS), hexamethyldisiloxane (HMDS), trimethylsilil borxle (SOB), diaceloxyditerliarybutosiloxane (DADBS), trimethylsilil phosphate (SOP), etc., with dielectric constants below 3.9 to 2.5. Available ultra-low dielectric constant dielectric materials, having dielectric constants below 2.5, include commercially available Teflon-AF, Teflon microemulsion, polimide nanofoams, silica aerogels, silica xerogels, and mesoporous silica. Stop layers and capping layers (where used) are of materials such as silicon nitride ($Si_xN_x$) or silicon oxynitride (SiON).

Figure 7:
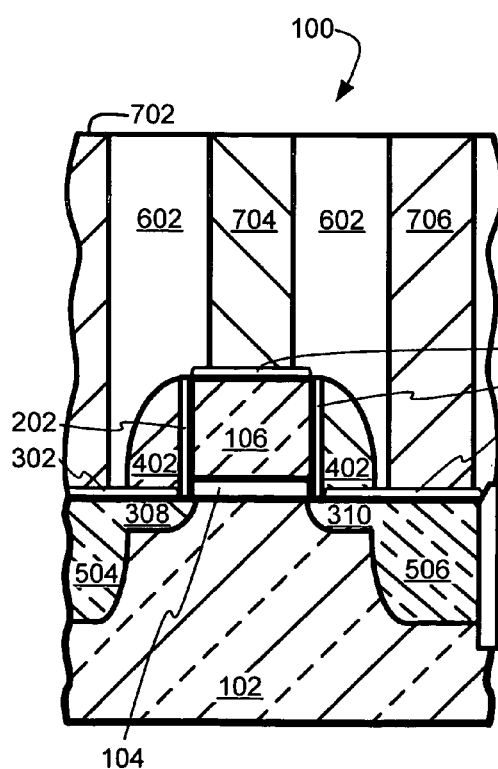
FIG. 7 is the structure of FIG. 6 after formation of metal contacts.

Referring now to FIG. 7, therein is shown the structure of FIG. 6 after formation of metal contacts 702, 704, and 706. The metal contacts 702, 704, and 706 are respectively electrically connected to the salicide layers 302, 304, and 306, and respectively to the deep S/D junction 504, the gate 106, and the deep S/D junction 506.

In various embodiments, the metal contacts 702, 704, and 706 are of metals such as tantalum (Ta), titanium (Ti), tungsten (W), alloys thereof, and compounds thereof. In other embodiments, the metal contacts 702, 704, and 706 are of metals such as copper (Cu), gold (Au), silver (Ag), alloys thereof, and compounds thereof with one or more of the above elements with diffusion barriers around them.

Figure 8:
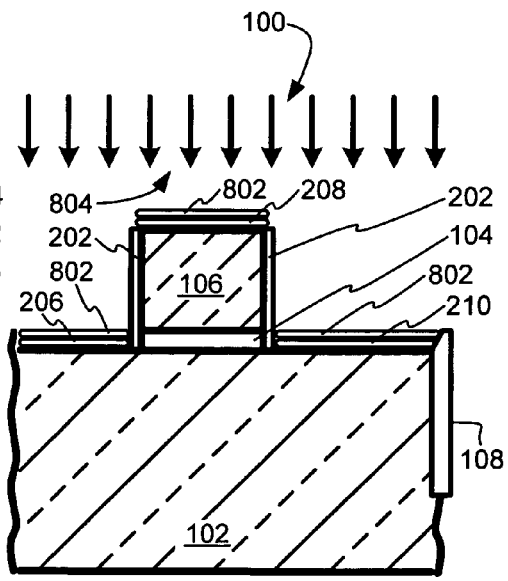
FIG. 8 illustrates a variation on the method for forming the shallow source/drain junctions.

Referring now to FIG. 8, therein is shown a variation on the method for forming the shallow S/D junctions 308 and 310. The variation adds an additional step between the steps illustrated above for FIGS. 2–3.

Thus, as shown in FIG. 8, following formation of the silicide metallic layers 206, 208, and 210 as illustrated in FIG. 2, a metallic cap layer 802 is formed on the tops thereof by a deposition process 804. The metallic cap layer 802 and the silicide metallic layers 206, 208, and 210 combine to form an alloyed metallic bi-layer that caps and deters outdiffusion of the super-saturated dopant through the top surfaces of the silicide metallic layers 206, 208, and 210.

For example, the silicide metallic layers 206, 208, and 210 formed by sputtering $Ni_xAs_y$, $Ni_xB_y$, or $Ni_xP_y$ would be caped by a layer of Ni. The silicide metallic layers 206, 208, and 210 formed by sputtering $Co_xAs_y$, $Co_xB_y$, or $Co_xP_y$ would be caped by a layer of Co. The silicide metallic layers 206, 208, and 210 formed by sputtering $Pt_xAs_y$, $Pt_xB_y$, or $Pt_xP_y$ would be caped by a layer of Pt. Of course, other combinations of materials, including combinations of dissimilar silicide and capping metals, may be used as appropriate.

The method of FIG. 8 then continues with the steps illustrated for FIGS. 3–7, beginning with the heating and annealing step that reacts the deposited silicide metallic layers 206, 208, and 210 to form the salicide layers 302, 304, and 306, and outdiffuses the dopant from the salicide layers 302 and 306 into the semiconductor substrate 102. The thermal outdiffusion of the dopant into the semiconductor substrate 102 again activates the outdiffused dopant atoms to form the shallow S/D junctions 308 and 310. The metallic cap layer 802 deters outdiffusion of the super-saturated dopant through the top surfaces of the silicide metallic layers 206, 208, and 210 during the heating and annealing process.

Figure 9:
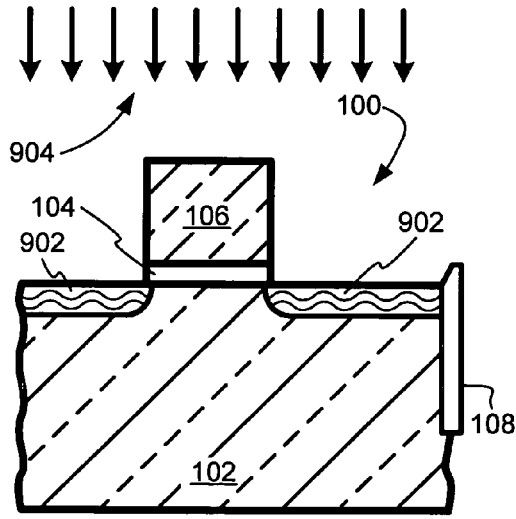
FIGS. 9–11 illustrate another variation on the method for forming the shallow source/drain junctions.
Figure 10:
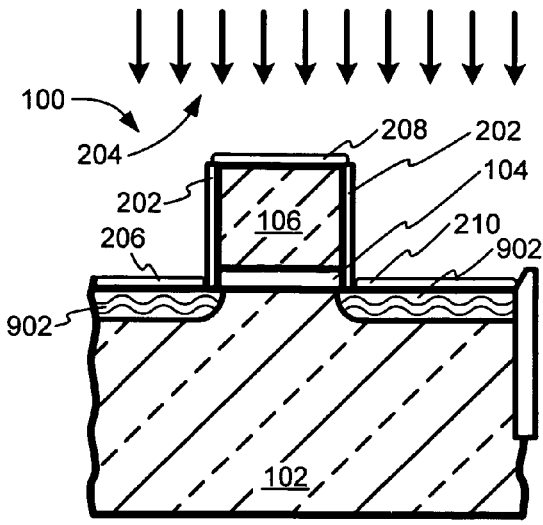
Figure 11:
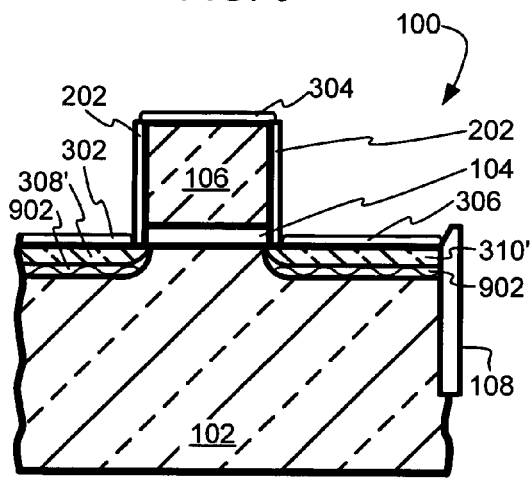

Referring now to FIGS. 9–11, therein is shown another variation on the method for forming the shallow S/D junctions 308 and 310. The variation adds an additional step between the steps illustrated above for FIGS. 1–2.

Thus, as shown in FIG. 9, following formation of the gate dielectric 104 and the gate 106 as illustrated in FIG. 1, a self-aligned amorphous layer 902 is formed in the surface of the semiconductor substrate 102 on each side of and adjacent the gate 106 and the gate dielectric 104. The amorphous layer 902 may be formed, for example, by a damaging ion implantation 904 of an inert species such as germanium (Ge), silicon (Si), or Argon (A). The implantation damage creates a disordered (amorphous) layer that presents much greater resistance to diffusion of dopants, thereby effectively limiting subsequent dopant diffusion to a very narrow penetration depth into the amorphous layer 902.

FIG. 10 corresponds to FIG. 2, showing formation of the insulating layer 202 and deposition of the doped silicide metallic layers 206, 208, and 210.

Alternatively, the doped silicide metallic layers 206, 208, and 210 may be deposited prior to the formation of the amorphous layer 902 by the damaging ion implantation 904 (FIG. 9).

FIG. 11 corresponds to FIG. 3, showing formation of the salicide layers 302, 304, and 306 and outdiffusion of the dopant from the salicide layers 302 and 306 into the amorphous layer 902 therebeneath. As before, the thermal outdiffusion of the dopant into the amorphous layer 902 activates the outdiffused dopant atoms in the amorphous layer 902 to form very shallow S/D junctions 308' and 310'.

The method of FIGS. 9–11 then continues with the steps illustrated for FIGS. 4–7, beginning with formation of the sidewall spacer 402 (FIG. 4).

Figure 12:
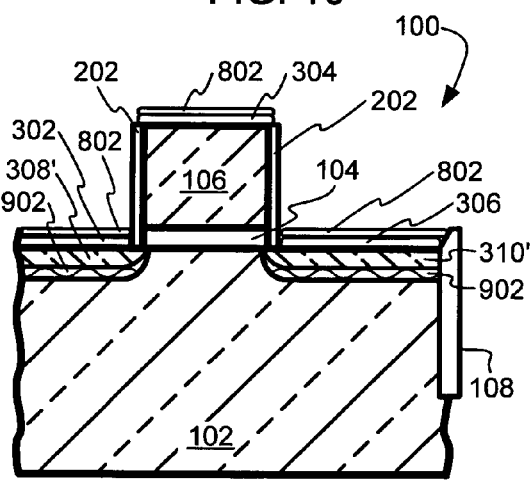
FIG. 12 shows a structure combining the variations illustrated in FIGS. 8–11.

Referring now to FIG. 12, therein is shown a structure combining the metallic cap layer 802, as taught in connection with the method and structure described in conjunction with FIG. 8, with the dopant diffusion depth-limiting properties of the amorphous layer 902, as taught in connection with the method and structure described in conjunction with FIGS. 9–11.

The combination of FIG. 12 may be fabricated, for example, by forming the metallic cap layer 802 on the tops of the silicide metallic layers 206, 208, and 210 subsequent to the process steps illustrated in conjunction with FIG. 10. The metallic cap layer 802 and the silicide metallic layers 206, 208, and 210 then combine to form an alloyed metallic bi-layer that caps and deters outdiffusion of the super-saturated dopant through the top surfaces of the silicide metallic layers 206, 208, and 210. This is followed, as before, with a heating and annealing step that reacts the deposited silicide metallic layers 206, 208, and 210 (cf. FIGS. 10–11). The heating and annealing reaction forms the salicide layers 302, 304, and 306 (FIG. 12), causes the dopant to outdiffuse from the salicide layers 302 and 306 into the amorphous layer 902 therebeneath, and activates the outdiffused dopant atoms in the amorphous layer 902 to form the very shallow S/D junctions 308' and 310'. The metallic cap layer 802 deters outdiffusion of the super-saturated dopant through the top surfaces of the silicide metallic layers 206, 208, and 210 during the heating and annealing process.

The fabrication of the transistor 100 according to the method described in conjunction with FIG. 12 is then completed in the same manner as described previously in conjunction with FIGS. 4–7, beginning with formation of the sidewall spacer 402 (FIG. 4).

Figure 13:
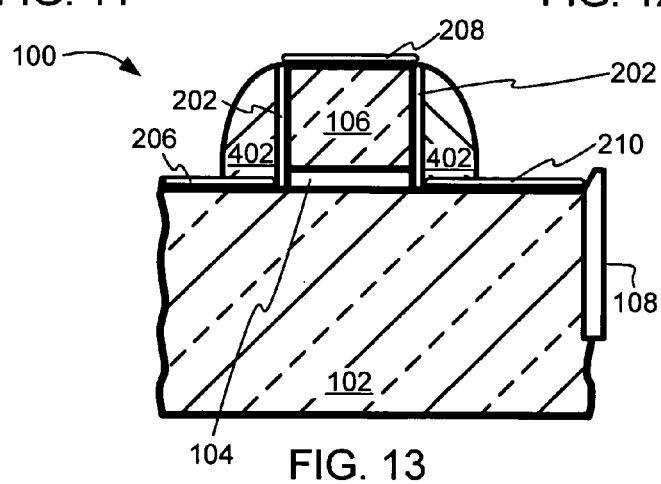
FIG. 13 illustrates still another variation on the method for forming the shallow source/drain junctions.

Referring now to FIG. 13, therein is shown a variation on the method for forming the shallow S/D junctions 308 and 310 (FIG. 5). The variation shown in (FIG. 13) replaces the steps illustrated above for FIGS. 3–4, eliminating the heating and annealing step that formed the shallow S/D junctions 308 and 310 (FIG. 3) at that stage of the process. By eliminating this heating and annealing step, heat cycles are preserved or saved, thereby reducing costs and improving operational efficiencies.

Thus, as shown in FIG. 13, following formation of the silicide metallic layers 206, 208, and 210 as illustrated in FIG. 2, a sidewall spacer 402 is formed in the same manner as described with respect to FIG. 4. The sidewall spacer 402, generally of silicon nitride, is thus a deposited layer that is etched in conventional manner to form the conventional curved shape as shown.

The method of FIG. 13 then continues with the steps illustrated for FIGS. 5–7. In this case, the high temperature anneal that follows the ion implantation 502 (FIG. 5) not only activates the implanted impurity atoms to form the deep S/D junctions 504 and 506, but it also reacts the deposited silicide metallic layers 206, 208, and 210 (FIG. 13) with the semiconductor substrate 102 and the gate 106 therebeneath. The reaction forms the salicide layers 302, 304, and 306 (FIG. 5) and outdiffuses the dopant from the salicide layers 302 and 306 into the semiconductor substrate 102. The thermal outdiffusion of the dopant from the salicide layers 302 and 306 into the semiconductor substrate 102 provides activated outdiffused dopant atoms that form the shallow S/D junctions 308 and 310.

The method of FIG. 13 thus saves energy and heat cycles by utilizing the single annealing step described in connection with FIG. 5 to form the salicide layers 302, 304, and 306, the shallow S/D junctions 308 and 310, and activate and form the deep S/D junctions 504 and 506.

It will be understood that the dopant can be expected to be activated immediately in the semiconductor substrate during the step of reacting the silicide metallic layer with the semiconductor substrate therebeneath to form the salicide layer and outdiffuse the dopant from the salicide layer into the semiconductor substrate therebeneath. This is due to the lack of damage to the semiconductor substrate crystalline structure that would have resulted from a dopant ion implantation (for which subsequent annealing is then conducted). Thus, the step of activating the outdiffused dopant in the semiconductor substrate to form shallow source/drain junctions beneath the salicide layer may be accomplished by the salicide formation process itself without the additional thermal annealing process, as well as by thermal annealing steps such as described above.

Figure 14:
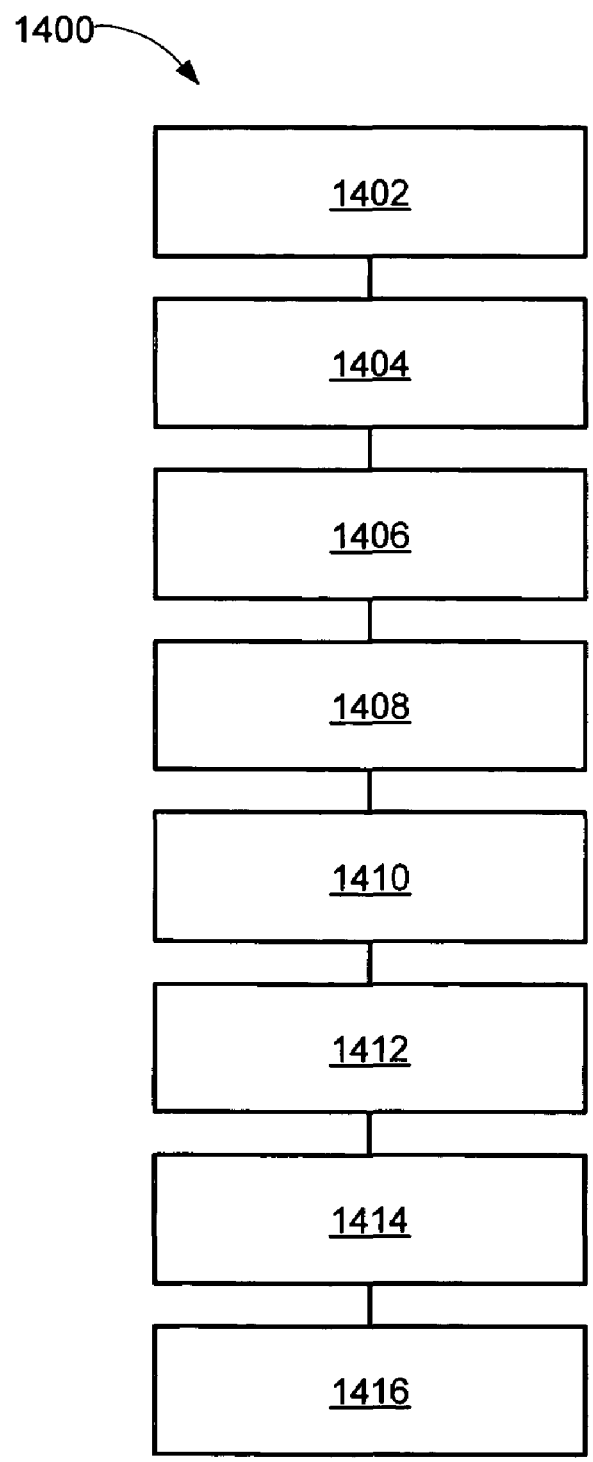
FIG. 14 is a simplified flow chart of the method of manufacturing the integrated circuit in accordance with the present invention.

Referring now to FIG. 14, therein is shown a simplified flow chart of a method 1400 in accordance with the present invention. The method 1400 includes: providing a semiconductor substrate in a step 1402; forming a gate dielectric on the semiconductor substrate in a step 1404; forming a gate on the gate dielectric in a step 1406; forming at least one super-saturated doped source silicide metallic layer on the semiconductor substrate adjacent the gate and the gate dielectric, the silicide metallic layer incorporating a substantially uniformly distributed dopant therein in a substantially uniform super-saturated concentration, in a step 1408; reacting the silicide metallic layer with the semiconductor substrate therebeneath to form a salicide layer and outdiffuse the dopant from the salicide layer into the semiconductor substrate therebeneath, in a step 1410; activating the outdiffused dopant in the semiconductor substrate to form a shallow source/drain junction beneath the salicide layer in a step 1412; depositing an interlayer dielectric above the semiconductor substrate in a step 1414; and forming a contact in the interlayer dielectric to the salicide layer in a step 1416.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of forming an integrated circuit comprising:
   providing a semiconductor substrate;
   forming a gate dielectric on the semiconductor substrate;
   forming a gate on the gate dielectric;
   forming at least one super-saturated doped source silicide metallic layer on the semiconductor substrate adjacent the gate and the gate dielectric, the silicide metallic layer incorporating a substantially uniformly distributed dopant therein in a substantially uniform super-saturated concentration;
   reacting the silicide metallic layer with the semiconductor substrate therebeneath to form a salicide layer and outdiffuse the dopant from the salicide layer into the semiconductor substrate therebeneath;
   activating the outdiffused dopant in the semiconductor substrate to form a shallow source/drain junction beneath the salicide layer;
   depositing an interlayer dielectric above the semiconductor substrate; and forming a contact in the interlayer dielectric to the salicide layer.

2. The method as claimed in claim 1 wherein forming the super-saturated doped source silicide metallic layer on the semiconductor substrate further comprises sputtering to form the silicide metallic layer super-saturated doped source having the substantially uniform distribution and concentration of the dopant throughout the silicide metallic layer.

3. The method as claimed in claim 1 further comprising forming a metallic cap layer on the silicide metallic layer to form an alloyed metallic bi-layer that caps and deters outdiffusion of the super-saturated dopant through the top surface of the silicide metallic layer.

4. The method as claimed in claim 1 further comprising forming an amorphous layer in the surface of the semiconductor substrate adjacent the gate and the gate dielectric prior to outdiffusing the dopant from the salicide layer into the semiconductor substrate.

5. The method as claimed in claim 1 wherein forming the contact to the salicide layer uses at least one material selected from tantalum, titanium, tungsten, copper, gold, silver, an alloy thereof, a compound thereof, and a combination thereof.

6. A method of forming an integrated circuit comprising:
providing a semiconductor substrate;
forming a gate dielectric on the semiconductor substrate;
forming a gate on the gate dielectric;
forming at least one super-saturated doped source silicide metallic layer on the semiconductor substrate adjacent the gate and the gate dielectric, the silicide metallic layer incorporating a dopant therein in a super-saturated concentration;
forming a metallic cap layer on the silicide metallic layer to form an alloyed metallic bi-layer that caps and deters outdiffusion of the super-saturated dopant through the top surface of the silicide metallic layer;
reacting the silicide metallic layer with the semiconductor substrate therebeneath to form a salicide layer and outdiffuse the dopant from the salicide layer into the semiconductor substrate therebeneath;
activating the outdiffused dopant in the semiconductor substrate to form a shallow source/drain junction beneath the salicide layer;
depositing an interlayer dielectric above the semiconductor substrate; and
forming a contact in the interlayer dielectric to the salicide layer.

7. The method as claimed in claim 6 wherein forming the super-saturated doped source silicide metallic layer on the semiconductor substrate further comprises sputtering to form the silicide metallic layer super-saturated doped source having a substantially uniform distribution and concentration of the dopant throughout the silicide metallic layer.

8. The method as claimed in claim 6 further comprising forming an amorphous layer in the surface of the semiconductor substrate adjacent the gate and the gate dielectric prior to outdiffusing the dopant from the salicide layer into the semiconductor substrate.

9. A method of forming an integrated circuit comprising:
providing a semiconductor substrate;
forming a gate dielectric on the semiconductor substrate;
forming a gate on the gate dielectric;
forming an amorphous layer in the surface of the semiconductor substrate adjacent the gate and the gate dielectric;
forming at least one super-saturated doped source silicide metallic layer on the semiconductor substrate amorphous layer adjacent the gate and the gate dielectric, the silicide metallic layer incorporating a dopant therein in a super-saturated concentration;
reacting the silicide metallic layer with the semiconductor substrate amorphous layer therebeneath to form a salicide layer and outdiffuse the dopant from the salicide layer into the semiconductor substrate amorphous layer therebeneath;
activating the outdiffused dopant in the semiconductor substrate amorphous layer to form a shallow source/drain junction beneath the salicide layer;
depositing an interlayer dielectric above the semiconductor substrate; and
forming a contact in the interlayer dielectric to the salicide layer.

10. The method as claimed in claim 9 wherein forming the super-saturated doped source silicide metallic layer on the semiconductor substrate further comprises sputtering to form the silicide metallic layer super-saturated doped source having a substantially uniform distribution and concentration of the dopant throughout the silicide metallic layer.

11. The method as claimed in claim 9 further comprising forming a metallic cap layer on the silicide metallic layer to form an alloyed metallic bi-layer that caps and deters outdiffusion of the super-saturated dopant through the top surface of the silicide metallic layer.

12. The method as claimed in claim 9 wherein forming the contact to the salicide layer uses at least one material selected from tantalum, titanium, tungsten, copper, gold, silver, an alloy thereof, a compound thereof, and a combination thereof.

13. A method of forming an integrated circuit comprising:
providing a semiconductor substrate;
forming a gate dielectric on the semiconductor substrate;
forming a gate on the gate dielectric;
forming an amorphous layer in the surface of the semiconductor substrate adjacent the gate and the gate dielectric;
sputtering to form super-saturated doped source silicide metallic layers on the semiconductor substrate amorphous layer adjacent the gate, the silicide metallic layers incorporating a substantially uniformly distributed dopant therein in a substantially uniform super-saturated concentration throughout the silicide metallic layers;
forming metallic cap layers on the silicide metallic layers to form alloyed metallic bi-layers that cap and deter outdiffusion of the super-saturated dopant through the top surfaces of the silicide metallic layers;
reacting the silicide metallic layers with the semiconductor substrate amorphous layer therebeneath to form salicide layers and outdiffuse the dopant from the salicide layers into the semiconductor substrate amorphous layer therebeneath;
activating the outdiffused dopant in the semiconductor substrate amorphous layer to form shallow source/drain junctions beneath the salicide layers;
depositing an interlayer dielectric above the semiconductor substrate; and
forming contacts in the interlayer dielectric to the salicide layers.

14. The method as claimed in claim 13 wherein forming the contacts to the salicide layers uses at least one material selected from tantalum, titanium, tungsten, copper, gold, silver, an alloy thereof, a compound thereof, and a combination thereof.

* * * * *

UNITED STATES PATENT AND TRADEMARK OFFICE
CERTIFICATE OF CORRECTION

PATENT NO. : 7,033,916 B1 Page 1 of 1
APPLICATION NO. : 10/770990
DATED : April 25, 2006
INVENTOR(S) : Pelella et al.

It is certified that error appears in the above-identified patent and that said Letters Patent is hereby corrected as shown below:

Column 2, line 38, delete "modem" and insert therefor --modern--

Signed and Sealed this

First Day of August, 2006

JON W. DUDAS
*Director of the United States Patent and Trademark Office*